United States Patent
Choi

(10) Patent No.: US 8,411,517 B2
(45) Date of Patent: Apr. 2, 2013

(54) DELAY LOCKED LOOP CIRCUIT INCLUDING DELAY LINE WITH REDUCED SENSITIVITY TO VARIATION IN PVT

(75) Inventor: Seok-Woo Choi, Seoul (KR)

(73) Assignee: Samsung Electronics Co., Ltd., Samsung-ro, Yeontong-gu, Suwon-si, Gyeonggi-do (KR)

( * ) Notice: Subject to any disclaimer, the term of this patent is extended or adjusted under 35 U.S.C. 154(b) by 475 days.

(21) Appl. No.: 12/717,641

(22) Filed: Mar. 4, 2010

(65) Prior Publication Data
US 2010/0226189 A1 Sep. 9, 2010

(30) Foreign Application Priority Data
Mar. 4, 2009 (KR) .................. 10-2009-0018438

(51) Int. Cl.
*G11C 7/00* (2006.01)
(52) U.S. Cl. .................... 365/194; 365/233.13; 327/158
(58) Field of Classification Search .................. 365/194, 365/233.13; 327/158
See application file for complete search history.

(56) References Cited

U.S. PATENT DOCUMENTS

| | | | |
|---|---|---|---|
| 5,790,612 A * | 8/1998 | Chengson et al. | 375/373 |
| 6,417,715 B2 * | 7/2002 | Hamamoto et al. | 327/291 |
| 6,771,097 B1 | 8/2004 | Ho et al. | |
| 6,985,401 B2 | 1/2006 | Jang et al. | |
| 7,408,379 B2 | 8/2008 | Cho et al. | |
| 7,474,572 B2 | 1/2009 | Lee et al. | |
| 7,477,083 B2 * | 1/2009 | Fujisawa et al. | 327/158 |

FOREIGN PATENT DOCUMENTS

| | | |
|---|---|---|
| JP | 2004-145709 | 5/2004 |
| JP | 2007-116574 | 5/2007 |
| KR | 1019990023085 | 3/1999 |

OTHER PUBLICATIONS

Wakerly, Digital Design Principles and Practices, 2006, Pearson Education, Inc., 4th edition. 8 pages.*

* cited by examiner

*Primary Examiner* — Alexander Sofocleous
*Assistant Examiner* — Lance Reidlinger
(74) *Attorney, Agent, or Firm* — Muir Patent Consulting, PLLC

(57) ABSTRACT

A delay locked loop circuit is disclosed. The circuit includes a phase detector for comparing the phase of an input clock signal with the phase of a feedback clock signal that is fed back into the phase detector, and for outputting a detection signal. The circuit also includes a control circuit unit for controlling a delay line in response to the detection signal, a delay line for delaying the input clock by a predetermined amount of delay in response to output impedance calibration codes applied to the delay line, and a replica circuit configured to have the same delay conditions as those of an actual clock path to a circuit of the semiconductor device, to receive a delay clock signal of the delay line, and to generate the feedback clock signal.

19 Claims, 3 Drawing Sheets

DELAY LOCKED LOOP CIRCUIT INCLUDING DELAY LINE WITH REDUCED SENSITIVITY TO VARIATION IN PVT

CROSS-REFERENCE TO RELATED APPLICATIONS

This application claims the benefit of Korean Patent Application No. 10-2009-0018438, filed on Mar. 4, 2009, in the Korean Intellectual Property Office, and entitled: "Delay Locked Loop Circuit Including Delay Line Insensitive to Variation in PVT," the contents of which are incorporated by reference herein in their entirety.

BACKGROUND

1. Field

The embodiments disclosed herein relate to a delay locked loop circuit, and more particularly, to a delay locked loop circuit including a delay line capable of delaying an input clock signal by a predetermined amount of delay so as to reduce sensitivity to variations in PVT (process, voltage, and/or temperature), and a synchronous semiconductor memory device including the same.

2. Description of the Related Art

In recent years, the speed and the degree of integration of dynamic random access memories generally used as the main memories of electronic systems have increased in order to meet user demands.

The dynamic random access memory device is a volatile memory having memory cells each of which has one access transistor and one storage capacitor as a unit memory cell, and has a refresh operation in addition to read and write operations.

High-performance DRAMs with an improved operation speed, such as a SDRAM (synchronous DRAM), a DDR SDRAM (double data rate SDRAM), and an FCRAM (fast cycle RAM), have been developed in this field. Among them, conventional SDRAM can input or output data at either the rising or falling edges of a clock signal. Meanwhile, the DDR SDRAM can input or output data at both the rising and falling edges of a clock signal. Therefore, the data transmission rate of the DDR SDRAM is two times that of a conventional SDRAM.

For example, when a memory system is operated at 400 MHz and transmits data at the rising and falling edges of a clock signal, a valid data transmission rate to one pin per second is 800 Mb/s. In this case, a data bit time is 1.25 ns, which is very short. In order to meet these timing requirements, it may be necessary to provide a circuit that matches the phase of an external system clock with the phase of an internal on-chip clock in an interface circuit.

When a clock that is input from the outside is used inside the circuit, clock skew occurs by the internal circuit, which may cause the external system clock signal and internal on-chip clock signal to be out of phase. A delay locked loop (DLL) is used to compensate the clock skew such that the phase of the internal clock signal is equal to the phase of the external clock signal. That is, the delay locked loop controls the time delay occurring when the clock input from the outside is used inside the circuit such that the phase of the internal clock signal is equal to that of the external clock signal.

The delay locked loop generally used in the high-performance DRAMs generates an internal clock signal whose phase is synchronized with that of the external clock signal (i.e., delayed and locked with respect to the external clock). As such, the internal clock signal is used as a signal for controlling data output timing.

As the operation frequency of an electronic system or a semiconductor memory device used in the electronic system has increased, the frequency range covered by the delay locked loop (hereinafter, referred to as "DLL") has been extended from a low frequency of 400 MHz to a high frequency of 1.6 GHz. That is, since a DLL circuit is used for a DDR memory in order to synchronize an internal clock with an external clock, the DLL circuit needs to satisfy a wide operation speed range required for present day commercial DRAM (DDR2: 400 MHz to 800 MHz, DDR3: 800 MHz to 1600 MHz).

In addition, the DLL circuit needs to have a wide delay range in order to exactly synchronize data with a clock even though a surrounding environment and a manufacturing process vary. In order to improve the operation speed in a semiconductor device, a DLL circuit may be used to meet requirements for fine delay adjustment.

The DLL circuits may be mainly classified into an analog DLL circuit and a digital DLL circuit. The analog DLL circuit uses an analog delay line to form a delay cell that is only slightly, if at all, sensitive to PVT changes. Therefore, it is possible to calculate the predictable total amount of delay. As a result, it is possible to use the analog DLL circuit while limiting the number of delay cells according to operation frequency ranges. However, since a bias circuit for driving an analog cell and other circuits are used in the analog DLL circuit, a relatively long wake-up time is required, and a large amount of current is consumed in the non-operation state of the DRAM.

Meanwhile, a digital DLL circuit has a relatively short wake-up time and hardly consumes a current in the non-operation state. However, in the digital DLL circuit, each delay cell including, for example, an inverter, has a significantly large response variation due to changes in PVT, and a large number of delay cells are required. In addition, the digital DLL circuit consumes a large amount of power during an operation.

Therefore, a delay line capable of stably performing a delay operation by a predetermined amount of delay with reduced sensitive to a variation in PVT would be desirable in a delay locked loop circuit.

SUMMARY

According to one embodiment, a delay locked loop circuit is disclosed. The circuit may be used in a semiconductor device. The circuit includes a phase detector for comparing the phase of an input clock signal with the phase of a feedback clock signal that is fed back into the phase detector, and for outputting a detection signal. The circuit also includes a control circuit unit for controlling a delay line in response to the detection signal, a delay line for delaying the input clock by a predetermined amount of delay in response to output impedance calibration codes applied to the delay line, and a replica circuit configured to have the same delay conditions as those of an actual clock path to a circuit of the semiconductor device, to receive a delay clock signal of the delay line, and to generate the feedback clock signal.

In another embodiment, a semiconductor memory device is disclosed. The semiconductor memory device includes a memory cell array including a plurality of memory cells arranged in a matrix, and a read and write circuit connected to the memory cells in the memory cell array, the read and write circuit including at least one of an input buffer and an output buffer. The semiconductor memory device additionally includes a delay locked loop circuit configured to output an output clock signal that is delay-locked as an input clock signal to the read and write circuit. The delay locked loop circuit includes a phase detector configured to compare the phase of an input clock signal with the phase of the feedback clock that is fed back into the phase detector, and to output a detection signal; a control circuit for controlling a delay locked operation in response to the detection signal; a delay line for delaying the input clock signal by a predetermined amount of delay in response to codes applied to control transistors in the delay line; and a replica circuit configured to have the same delay conditions as those of an actual clock path to the read and write circuit of the semiconductor memory device, to receive a delay clock signal of the delay line, and to generate the output clock signal. As a result of using the codes, the delay line has reduced sensitivity to variations in PVT.

In another embodiment, a delay line circuit for delaying an input clock signal comprises a set of inverter circuits connected in series. The delay line circuit includes an initial inverter circuit and a final inverter circuit. The initial inverter circuit includes a first node for receiving an input clock signal that is also input into a phase detector, and a second node for outputting a delayed inverted input clock signal to another inverter circuit. The initial inverter circuit further includes a first set of pull-up transistors, each having a gate connected to the first node and a source connected to a control transistor, and a first set of pull-down transistors, each having a gate connected to the first node and a source connected to a control transistor. The final inverter circuit includes a third node for receiving an inverted delayed input clock signal from another of the set of inverter circuits, and a fourth node for outputting a delay clock signal that is output to a replica circuit and to an output clock buffer for use in a semiconductor device. The final inverter circuit additionally includes a second set of pull-up transistors, each having a gate connected to the third node and a source connected to a control transistor, and a second set of pull-down transistors, each having a gate connected to the third node and a source connected to a control transistor.

According to the embodiments disclosed herein, a wake-up time is reduced and power consumption is reduced or minimized both during an operation and in a standby state. Therefore, when the delay locked loop circuit is used in a semiconductor memory device, such as a DRAM, the reliability and stability of an operation are improved.

BRIEF DESCRIPTION OF THE DRAWINGS

The above and other features and advantages will become more apparent to those of ordinary skill in the art by describing in detail example embodiments with reference to the attached drawings, in which.

It should be noted that these figures are intended to illustrate the general characteristics of methods, structure, and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. The use of similar or identical reference numbers in the various drawings is intended to indicate the presence of a similar or identical element or feature.

DETAILED DESCRIPTION

Example embodiments will now be described more fully hereinafter with reference to the accompanying drawings. Exemplary embodiments may, however, be embodied in different forms and should not be construed as limited to the embodiments set forth herein.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc., may be used herein to describe various elements, components, regions, and/or sections, these elements, components, regions, and/or sections should not be limited by these terms. These terms are only used to distinguish one element, component, region, or section from another element, component, region, or section. Thus, unless noted otherwise, a first element, component, region, or section discussed below could be termed a second element, component, region, or section without departing from the teachings of example embodiments.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of stated features, integers, steps, operations, elements, and/or components, but do not preclude the presence or addition of one or more other features, integers, steps, operations, elements, components, and/or groups thereof.

Figure 1:
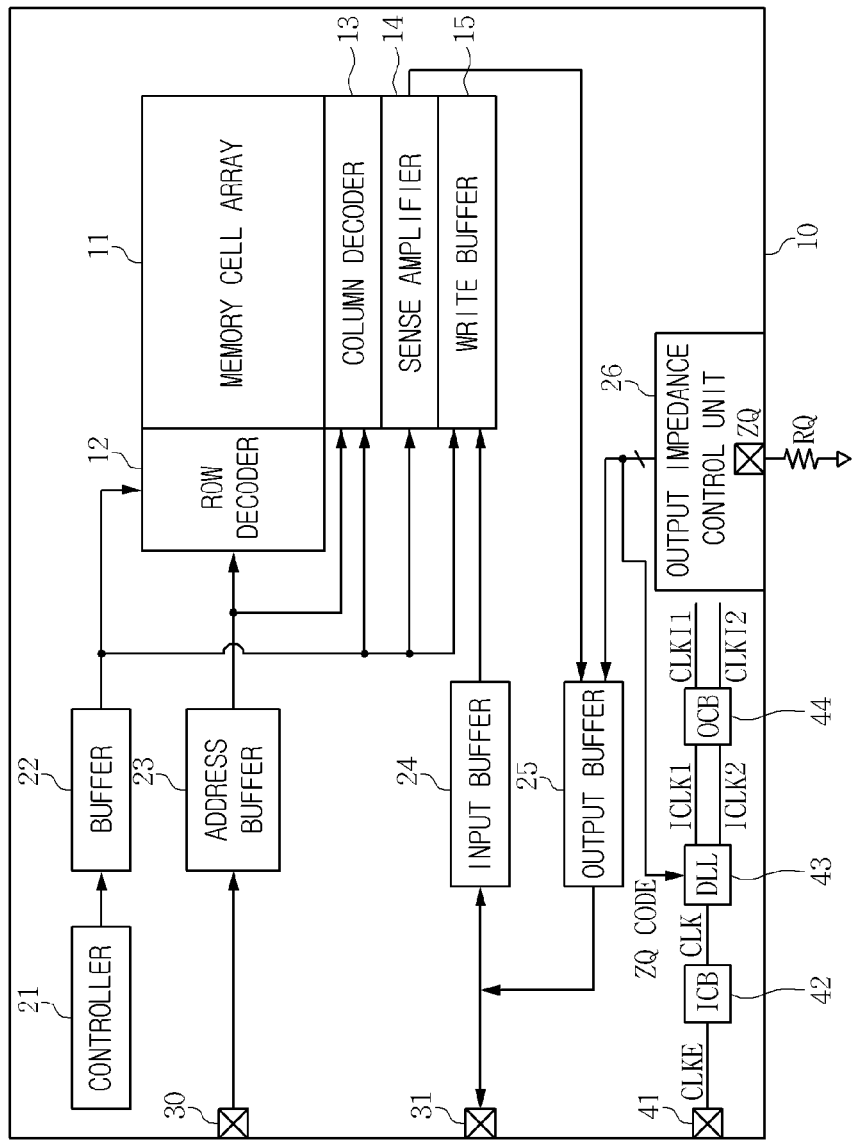
FIG. 1 is a block diagram illustrating an exemplary synchronous semiconductor memory device consistent with certain disclosed embodiments.

FIG. 1 is a block diagram illustrating the structure of an exemplary synchronous semiconductor memory device. In one embodiment, the synchronous semiconductor memory device can be adapted to include a DLL circuit, such as described in connection with FIG. 2 below.

Specifically, FIG. 1 is a block diagram schematically illustrating an example of the internal structure of a memory device including an output impedance controller. In FIG. 1, a memory device 10 includes an address pad 30 that receives an address. The address is transmitted to a row decoder 12 and a column decoder 13 through an address buffer 23 in order to select a cell of a memory cell array 11 for reading or writing data. In order to write data to the cell selected from the memory cell array 11, write data is transmitted to a write buffer 15 through an input/output pad 31 and an input buffer 24. In order to read data from the selected cell, data stored in the selected cell is read and transmitted to the input/output pad 31 through a sense amplifier 14 and an output buffer 25.

A timing controller 21 provides a timing control signal to a buffer 22, and the buffer 22 transmits the control signal to the row decoder 12, the column decoder 13, the sense amplifier 14, and the write buffer 15 in order to control the timing of write and read operations.

The exemplary memory device 10 shown in FIG. 1 further includes an output impedance control unit 26 that controls the impedance of the output buffer 25. The output buffer 25 and the output impedance control unit 26 are programmable for achieving an impedance control function.

In one embodiment, an external resistor RQ indicating a target impedance value is connected to a ZQ terminal. The ZQ terminal may be used, for example, to control an impedance in part of the memory device, based on certain codes. The driving capabilities of transistors in an output driver of the output buffer 25 may be adjusted by matching the impedance of the output driver with a value defined by the resistor RQ. Specifically, in one embodiment, the output impedance control unit 26 includes a circuit that has variable impedances, and the circuit and variable impedances correspond to a circuit and variable impedances associated with transistors of the output driver.

That is, the output driver of the output buffer 25 may include a pull-up transistor group including PMOS transistors and a pull-down transistor group including NMOS transistors. The impedance of the output buffer may be controlled by control systems corresponding to the transistor groups of the output driver. As such, the pull-up and pull-down transistors are turned on or off by ZQ calibration codes supplied from the output impedance control unit 26 such that the impedances thereof are controlled. Examples of impedance calibration circuits and codes used in connection with a memory cell array are described in U.S. Pat. No. 7,408,379, issued to Cho et al., and incorporated herein by reference in its entirety. Further examples of impedance calibration circuits can be seen in U.S. Pat. No. 6,771,097, issued to Poh Ho et al., also incorporated herein by reference in its entirety.

The memory device 10 of FIG. 1 further includes a DLL circuit 43 that receives an external clock signal CLKE through a clock pad 41 and outputs an internal clock signal CLKI whose phase is synchronized with the external clock signal. The external clock signal CLKE may pass through an input clock buffer ICB 42 from which a different clock signal CLK is output, the DLL circuit 43, from which clock signals ICLK1 and ICLK2 are output, and an output clock buffer OCB 44, before being output as internal clock signals CLKI1 and/or CLKI2, which are sent to circuits in the memory device 10. The clock signals CLKE, CLK, and ICLK1 and ICLK2 may all have different timings. In one embodiment, however, the internal clock signals CLKI1 and/or CLKI2 have the same phase as CLKE, and are applied as driving reference signals to various buffers and circuit blocks in the memory device 10 (e.g., an input buffer, output buffer, address buffer, and other components of a read/write circuit). As described further below, the DLL circuit 43 of the memory device 10 shown in FIG. 1 may use the ZQ calibration codes to drive delay cells of a delay line in order to have delay line characteristics with reduced sensitivity to PVT.

By using a circuit such as described herein, the delay line has very low sensitivity to changes in PVT. For example, the delay line may not significantly change its response time due to regular fluctuations in PVT (i.e., timing changes in the circuit response due to fluctuations in PVT may be negligible). In addition, the delay line has a relatively short wake-up time, and is capable of reducing current consumption both during an operation period and during a non-operation period. In one embodiment, the ZQ output impedance calibration codes shown in FIG. 1 are used for the delay cell of the digital DLL circuit shown in FIG. 2. As such, a delay line having a delay cell with reduced sensitivity to PVT can be achieved.

Figure 2:
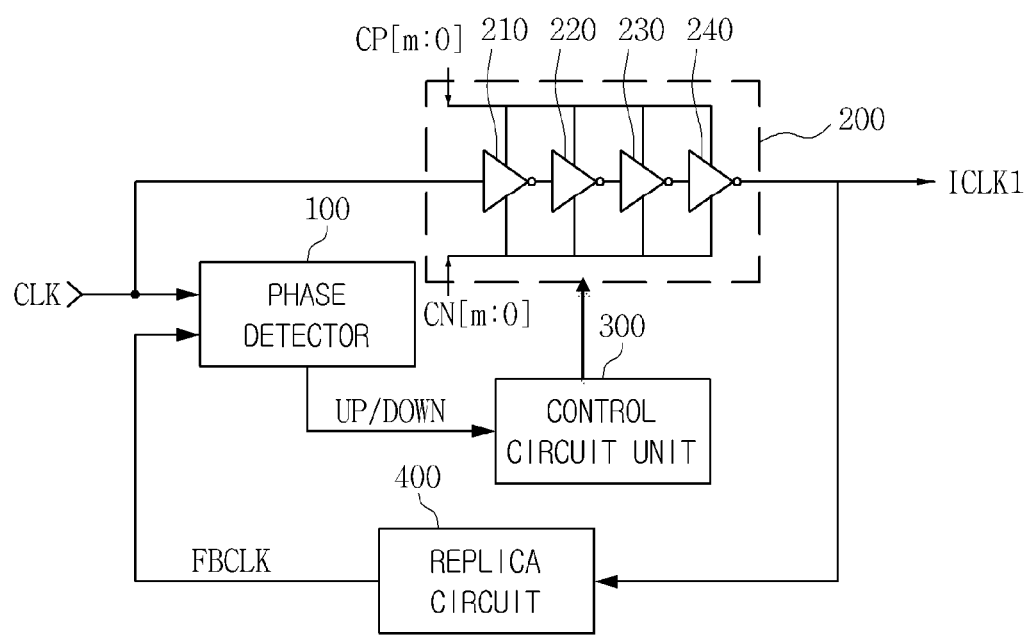
FIG. 2 is a block diagram illustrating an exemplary DLL circuit which includes a delay line with reduced sensitivity to PVT and which is applicable to the semiconductor memory device shown in FIG. 1, consistent with certain disclosed embodiments.

FIG. 2 is a detailed block diagram illustrating the structure of an exemplary DLL circuit which includes a delay line with reduced sensitivity to PVT, and which is applicable to the semiconductor memory device shown in FIG. 1.

FIG. 2 shows the wiring structure of the DLL circuit according to an embodiment that includes a phase detector 100, a delay line 200, a replica circuit 400, and a control circuit unit 300, which is applicable to a general DDR DRAM. Phase detectors, replica circuits, and control circuits are known in the field of delay locked loop circuits, and details of these elements are therefore not described herein.

The phase detector 100 compares the phase of an input clock signal CLK output from an input clock buffer with the phase of a feedback clock signal FBCLK that is fed back into the phase detector 100 from the delay line 200, and outputs a detection signal UP/DOWN. The control circuit unit 300 controls a delay locked operation in response to the detection signal UP/DOWN. For example, in one embodiment, the control circuit unit 300 is connected to the delay line 200 and instructs the delay line to either increase or decrease the delay. Although FIG. 2 shows only a single "line" connecting the control circuit unit 300 to the delay line 200, this is for illustration purposes only. In one embodiment, for example, the control signal output from control circuit unit 300 may be transmitted to a circuit that controls the number of inverters (discussed further below) that operate to control the delay of the input clock signal CLK (e.g., using one or more switches and other circuitry).

As shown in FIG. 2, in one embodiment, the delay line circuit 200 includes four inverters, conceptually shown as 210, 220, 230, and 240. Greater or fewer numbers of inverters may be used. In one embodiment, the delay line circuit 200 receives driving signals CP[m:0] and CN[m:0], which cause certain transistors in the delay line to turn on or off, thereby controlling the impedance and delay of the delay line. For example, in one embodiment, the driving signals CP[m:0] and CN[m:0] each include a set of (m+1) signals (i.e., bits) (for example, 3, 4, 5, etc.) sent to transistors in the delay line, in order to delay the clock signal CLK by a predetermined amount $\Delta D$, causing the delay circuit to be insensitive to regular variations in PVT. In one embodiment, the driving signals are the same signals as output impedance (ZQ) calibration codes applied to the output driver of the output buffer 25 shown in FIG. 1.

In one embodiment, the replica circuit 400 is configured to have the same conditions as those of an actual clock path to the read/write circuit of the semiconductor memory device. As such, the delay caused by the replica circuit 400 mimics that of the actual clock path of the internal clock signal CLKI1 or CLKI2 through the clock circuit. As a result, the feedback clock signal FBCLK will have a time shift equal to that of the actual clock circuit, which time shift is then fed back into phase detector 100.

Figure 3:
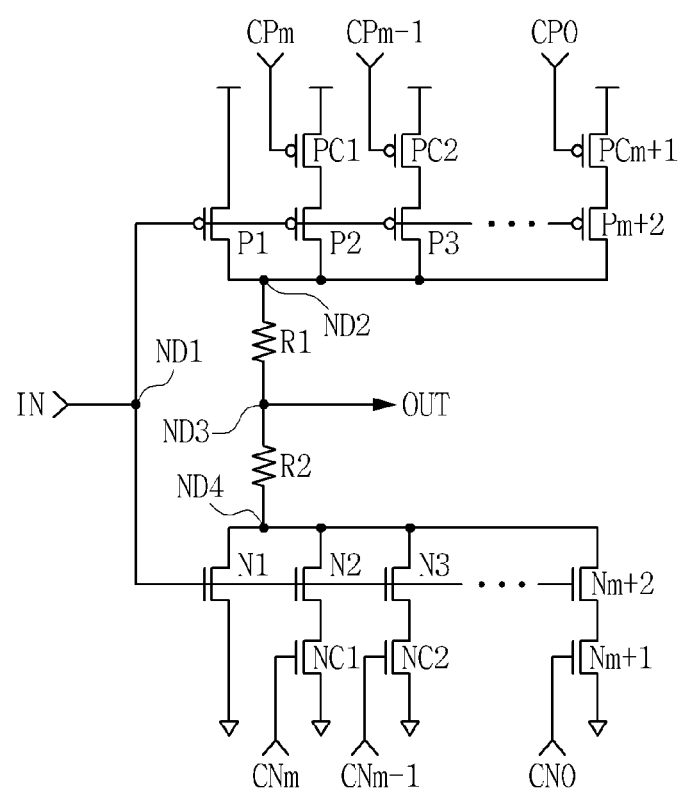
FIG. 3 is a circuit diagram illustrating a detailed example of the delay line shown in FIG. 2, consistent with certain disclosed embodiments.

FIG. 3 is a circuit diagram illustrating an example of the structure of the delay line shown in FIG. 2. In the embodiment depicted in FIG. 3, the circuit shown in FIG. 3, including transistors PC1-PCm+1, P1-Pm+2, R1, R2, N1-Nm+2, and NC1-NCm+1 serves as an inverter circuit (e.g., one of the inverters 210, 220, 230, or 240 depicted in FIG. 2) such that the IN signal is the input to the inverter, and the OUT signal is the output from the inverter. Each of inverters 210, 220, 230, and 240 can include the structure and elements described in FIG. 3.

As can be seen from FIG. 3, the exemplary delay line 200 includes a PMOS transistor group and an NMOS transistor group. As shown, the PMOS transistor group includes PMOS transistors PC1 to PCm+1 for control, pull-up PMOS transistors P1 to Pm+2, and a resistor R1 that is connected between a pull-up node ND2 and an output node ND3. The NMOS transistor group includes NMOS transistors NC1 to NCm+1 for control, pull-down NMOS transistors N1 to Nm+2, and a resistor R2 connected between a pull-down node ND4 and the output node ND3.

For example, when the driving signals CP0 to CPm and CN0 to CNm are set such that MOS transistors PC1 to PCm+1 and NC1 to NCm+1 are all turned on, a delay associated with the inverter circuit will be at a minimum. Conversely, when the driving signals CP0 to CPm and CN0 to CNm are set such that MOS transistors PC1 to PCm+1 and NC1 to NCm+1 are all turned off, a delay associated with the inverter circuit will be at a maximum. Driving signals may also be set such that some transistors are on and some are off, in order to more precisely control the delay.

In the exemplary embodiment shown in FIG. 3, the delay of the inverter from switching from high to low (or low to high) is adjusted by the CP and CN codes, which turn on or off the NMOS and PMOS transistors. That is, the path the current traverses to get from Vcc to node ND3 includes a set of parallel transistor segments (i.e., the segment including P1 is in parallel with the segment including the transistors PC1 and P2, the segment including transistors PC2 and P3, etc.) in series with resistor R1, and similarly, the path the current traverses to get from node ND3 to ground includes a set of parallel transistor segments (i.e., the segment including N1 is in parallel with the segment including the transistors NC1 and N2, the segment including transistors NC2 and N3, etc.) in series with resistor R2. The CP and CN codes control which of the parallel transistor segments are on and which are off. If more of the PMOS and NMOS transistor segments are on, then the resistances associated with the PMOS and NMOS segments of the inverter circuit are less, which results in a faster response. Conversely, if fewer of the transistor segments are on, then the resistances associated with the PMOS and NMOS segments of the inverter circuit are greater, which results in a slower response and more delay.

In one embodiment, the circuit elements of the delay circuit shown in FIG. 3 may be selected to be the same as those in the output driver of the output buffer 25 shown in FIG. 1, and the sizes of transistors in the delay cell may be different from those in the output driver, but have the same size ratios. That is, a circuit such as shown in FIG. 3 can be used in both the output buffer 25 and the delay line 200 in order to control the impedance in both units. Furthermore, the driving signals CPm to CP0 and CNm to CN0 may be selected to be the same ZQ calibration codes that are applied to the output driver.

In effect, the delay amount of the delay cell is affected by an RC delay. The capacitance C due to the transistors is hardly affected by PVT. In addition, by adjusting the output impedance calibration codes, the impedance of the inverter remains substantially unaffected by PVT (e.g., the resistance associated with the inverter remains constant). As a result, the RC delay does not vary depending on PVT, and the delay cell shown in FIG. 3 is maintained at a fixed delay value that is substantially insensitive to a variation in PVT.

According to one embodiment, the number of delay cells shown in FIGS. 2 and 3 (e.g., the number of inverters) is much lower (e.g., in one embodiment by about 50%) than the number of delay cells in a delay circuit that uses typical inverters. Therefore, it is possible to reduce the power consumed by the circuit.

In the embodiments shown in FIG. 2 and FIG. 3, when the driving signals CP[m:0] and CN[m:0], are applied to the delay line 200, the delay line 200 maintains a predetermined amount of delay regardless of a variation in PVT. Furthermore, because of the use of the transistors P1 to Pm+2, PC1 to PCm+1, N1 to Nm+2 and NC1 to NCm+1, the delay line 200 has a relatively short wake-up time and it is possible to reduce current consumption both during an operation period and during a non-operation period.

The semiconductor device disclosed herein may be any type of device that uses a DLL circuit. For example, the semiconductor device may be a memory device such as DRAM, or a DDR or QDR synchronous semiconductor memory device. The semiconductor device may additional be another device such as, for example, a microprocessor device. When the disclosed delay locked loop circuit is used for a semiconductor device as described herein, it is possible to improve the reliability and stability of an operation.

While various embodiments have been shown and described with reference to the drawings, it will be understood by one of ordinary skill in the art that various changes in form and details may be made therein without departing from the spirit and scope of the example embodiments. For example, fewer or more transistors and/or resistors may be used in the delay circuit to accomplish the features described herein. In addition, the delay circuit may be used in different types of devices responsive to an external clock, such as a microprocessor or logic circuit. The scope of the exemplary embodiments should be evaluated in view of the following claims.

What is claimed is:

1. A delay locked loop circuit for use in a semiconductor device, the delay locked loop circuit comprising:
   a phase detector for comparing the phase of an input clock signal with the phase of a feedback clock signal that is fed back into the phase detector, and for outputting a detection signal;
   a control circuit unit for controlling a delay line in response to the detection signal;
   a delay line for delaying the input clock signal by a predetermined amount of delay in response to output impedance calibration codes applied to the delay line; and
   a replica circuit configured to have the same delay conditions as those of an actual clock path to a circuit of the semiconductor device, to receive a delay clock signal of the delay line, and to generate the feedback clock signal,
   wherein the delay line further comprises:
   two or more inverter circuits in series;
   a first node at a first inverter circuit for receiving an the input clock signal;
   a second node at the first inverter circuit for outputting an inverted delayed clock signal;
   a first set of pull-up transistors, each having a gate connected to the first node and a drain connected to a third node;
   a first resistor connected at one end to the second node and connected at the other end to the third node;
   a set of pull-down transistors, each having a gate connected to the first node drain connected to a fourth node; and
   a second resistor connected at one end to the second node and connected at the other end to the fourth node.

2. The delay locked loop circuit of claim 1, wherein the delay line includes a PMOS transistor group and an NMOS transistor group.

3. The delay locked loop circuit of claim 2, wherein the output impedance calibration codes are the same output impedance calibration codes applied to an output driver of an output buffer of the semiconductor device.

4. The delay locked loop circuit of claim 2, wherein
the MOS transistors included in the delay line have the same configuration as MOS transistors in an output driver of an output buffer of the semiconductor device, and
the MOS transistors in each of the MOS transistor groups are connected to each other such that the size ratio of transistors of the output driver is maintained.

5. The delay locked loop circuit of claim 1, further comprising:
a set of first control transistors, each control transistor having a source connected to a power supply, a drain connected to the source of a respective transistor of the set of pull-up transistors, and a gate connected to a signal line that receives part of the output impedance calibration code; and
a set of second control transistors, each control transistor having a drain connected to a source of a respective transistor of the set of the pull-down transistors, a source connected to ground, and a gate connected to a signal line that receives part of the output impedance calibration code.

6. The delay locked loop circuit of claim 1, wherein the output impedance calibration codes are 4 bits or more.

7. The delay locked loop circuit of claim 1, wherein the detection signal output from the phase detector is an up or down signal.

8. The delay locked loop circuit of claim 1, further comprising:
an input clock buffer receiving an external clock signal and outputting the input clock signal; and
an output clock buffer receiving the delay clock signal and outputting an internal clock signal,
wherein the output impedance calibration codes are adjustable to cause the delay line to be substantially insensitive to changes in PVT.

9. A semiconductor memory device comprising:
a memory cell array including a plurality of memory cells arranged in a matrix;
a read/write circuit connected to the memory cells in the memory cell array, the read/write circuit including at least one of an input buffer and an output buffer; and
a delay locked loop circuit configured to output an output clock signal that is delay-locked as an input clock signal to the read/write circuit,
wherein the delay locked loop circuit includes:
a phase detector configured to compare the phase of an input clock signal with the phase of a feedback clock signal that is fed back into the phase detector, and to output a detection signal;
a control circuit for controlling a delay locked operation in response to the detection signal;
a delay line for delaying the input clock signal by a predetermined amount of delay in response to codes applied to control transistors in the delay line; and
a replica circuit configured to have the same delay conditions as those of an actual clock path to the read/write circuit of the semiconductor memory device, to receive a delay clock signal of the delay line, and to generate the feedback clock signal, wherein as a result of using the codes, the delay line has reduced sensitivity to variations in PVT,
wherein the delay line further comprises:
a first inverter circuit comprising:
a first node for receiving the input clock signal,
a second node for outputting an inverted delayed input clock signal,
a set of pull-up transistors, each having a gate connected to the first node and a drain connected to a third node,
a first resistor connected at one end to the second node and connected at the other end to the third node,
a set of pull-down transistors, each having a gate connected to the first node and a drain connected to a fourth node, and
a second resistor connected at one end to the second node and connected at the other end to the fourth node.

10. The semiconductor memory device of claim 9, wherein the semiconductor memory device is one of a DDR synchronous semiconductor memory device and a QDR synchronous semiconductor device.

11. The semiconductor memory device of claim 9, wherein the delay line includes inverter circuits, each including a PMOS transistor group and an NMOS transistor group.

12. The semiconductor memory device of claim 11, wherein MOS transistors in each of the MOS transistor groups are connected to each other such that the size ratio of transistors of the MOS transistors in each MOS transistor group are the same ratio as the size ratio of MOS transistors in an output driver of the semiconductor device.

13. The semiconductor memory device of claim 9, wherein the delay line further comprises:
a second inverter circuit in series with the first inverter circuit, the second inverter circuit including:
a fifth node for receiving a delayed inverted input clock signal;
a sixth node for outputting the delay clock signal;
a set of pull-up transistors, each having a gate connected to the fifth node and a drain connected to a seventh node;
a third resistor connected at one end to the sixth node and connected at the other end to the seventh node;
a set of pull-down transistors, each having a gate connected to the fifth node and a drain connected to an eighth node; and
a fourth resistor connected at one end to the sixth node and connected at the other end to the eighth node.

14. The semiconductor memory device of claim 9, wherein the codes include output impedance calibration codes.

15. A delay line circuit for delaying an input clock signal, comprising a set of inverter circuits connected in series, and including:
an initial inverter circuit, including:
a first node for receiving an input clock signal that is also input into a phase detector,
a second node for outputting a delayed inverted input clock signal to another inverter circuit,
a first set of pull-up transistors, each having a gate connected to the first node and a source connected to a control transistor, and
a first set of pull-down transistors, each having a gate connected to the first node and a source connected to a control transistor; and
a final inverter circuit, including:
a third node for receiving an inverted delayed input clock signal from another of the set of inverter circuits,
a fourth node for outputting a delay clock signal that is output to a replica circuit and to an output clock buffer for use in a semiconductor device, a second set of pull-up transistors, each having a gate connected to the third node and a source connected to a control transistor, and a second set of pull-down transistors, each having a gate connected to the third node and a source connected to a control transistor.

16. The delay line circuit of claim 15, further comprising:

a fifth node connected to a drain of each transistor of the first set of pull-up transistors;

a first resistor connected at one end to the fifth node and connected at the other end to the second node;

a sixth node connected to a drain of each transistor of the first set of pull-down transistors;

a second resistor connected at one end to the sixth node and connected at the other end to the second node;

a seventh node connected to a drain of each transistor of the second set of pull-up transistors;

a third resistor connected at one end to the seventh node and connected at the other end to the fourth node;

an eighth node connected to a drain of each transistor of the second set of pull-down transistors; and a fourth resistor connected at one end to the eighth node and connected at the other end to the fourth node.

17. The delay line circuit of claim 16, wherein:

the first node is connected to an input clock buffer that receives an external clock signal;

the fourth node is connected to an output clock buffer that outputs an internal clock signal; and impedance calibration codes are transmitted through the signal lines to gates of the control transistors, such that the external clock signal and the internal clock signal are in phase.

18. The delay line circuit of claim 16, wherein the sixth node is connected to the replica circuit, which replicates the delay associated with a clock path in the semiconductor device.

19. The delay line circuit of claim 15, wherein:

each transistor of a first set of control transistors has a source connected to a voltage source, a drain connected to the source of a respective transistor of a set of pull-up transistors, and a gate connected to a signal line; and each transistor of a second set of second control transistors has a drain connected to a source of a respective transistor of a set of pull-down transistors, a source connected to ground, and a gate connected to a signal line.

* * * * *